(12) United States Patent
Hori

(10) Patent No.: US 10,194,546 B2
(45) Date of Patent: Jan. 29, 2019

(54) DISPLAY DEVICE AND STAND

(71) Applicant: Panasonic Intellectual Property Management Co., Ltd., Osaka (JP)

(72) Inventor: Masatoshi Hori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/509,603

(22) PCT Filed: Dec. 14, 2015

(86) PCT No.: PCT/JP2015/006217
§ 371 (c)(1),
(2) Date: Mar. 8, 2017

(87) PCT Pub. No.: WO2016/103620
PCT Pub. Date: Jun. 30, 2016

(65) Prior Publication Data
US 2017/0295659 A1  Oct. 12, 2017

(30) Foreign Application Priority Data

Dec. 26, 2014  (JP) .................................. 2014-266517

(51) Int. Cl.
*H05K 5/02* (2006.01)
*G09F 9/00* (2006.01)
(Continued)

(52) U.S. Cl.
CPC ............. *H05K 5/0234* (2013.01); *G09F 9/00* (2013.01); *H04N 5/64* (2013.01); *H05K 5/0017* (2013.01);
(Continued)

(58) Field of Classification Search
CPC .. F16M 11/26; F16M 11/046; F16M 2200/08; G06F 1/1601; G06F 1/166;
(Continued)

(56) References Cited

U.S. PATENT DOCUMENTS

2002/0051349 A1* 5/2002 Serizawa ............. H01R 13/582
361/752
2004/0211866 A1* 10/2004 Jung ..................... F16M 11/046
248/133
(Continued)

FOREIGN PATENT DOCUMENTS

JP   2003-061010   2/2003
JP   2006-227405   8/2006
(Continued)

OTHER PUBLICATIONS

International Search Report of PCT application No. PCT/JP2015/006217 dated Mar. 15, 2016.
(Continued)

*Primary Examiner* — Steven T Sawyer
*Assistant Examiner* — Sagar Shrestha
(74) *Attorney, Agent, or Firm* — McDermott Will & Emery LLP

(57) ABSTRACT

A display device includes a display unit provided with a display screen on a front side, and a stand that supports the display unit from below. The stand includes a base that supports the display unit at a rear side of the display unit and extends in a lateral width direction of the display unit, and a pair of legs that supports both longitudinal ends of the base from below respectively and extends across a lower edge of the display unit in a front-rear direction.

9 Claims, 17 Drawing Sheets

(51) Int. Cl.
*H04N 5/64* (2006.01)
*H05K 5/00* (2006.01)
*H05K 5/03* (2006.01)
*G09F 9/30* (2006.01)

(52) U.S. Cl.
CPC ............... H05K 5/02 (2013.01); H05K 5/03 (2013.01); *G09F 9/301* (2013.01)

(58) Field of Classification Search
CPC ...... H05K 5/0234; H05K 5/0017; H05K 5/03; H04N 5/64; G09F 9/301
See application file for complete search history.

(56) References Cited

U.S. PATENT DOCUMENTS

| | | | | |
|---|---|---|---|---|
| 2005/0152109 | A1* | 7/2005 | Choi | F16M 11/041 361/679.28 |
| 2005/0253037 | A1* | 11/2005 | Kim | F16M 11/10 248/442.2 |
| 2006/0208145 | A1 | 9/2006 | Chen | |
| 2008/0278044 | A1* | 11/2008 | Honda | F16M 11/10 312/223.3 |
| 2009/0121097 | A1 | 5/2009 | Takao | |
| 2013/0155655 | A1* | 6/2013 | Lee | H05K 5/03 362/97.1 |
| 2013/0168335 | A1* | 7/2013 | Gillespie | F16M 11/041 211/26 |
| 2014/0126125 | A1* | 5/2014 | Yamamoto | G02F 1/133308 361/679.01 |
| 2014/0185252 | A1* | 7/2014 | Sakurada | G02F 1/133308 361/752 |
| 2014/0355805 | A1* | 12/2014 | Park | H04N 5/64 381/333 |
| 2015/0293553 | A1* | 10/2015 | Aoyagi | G05G 1/025 248/422 |
| 2015/0355675 | A1* | 12/2015 | Lv | G06F 1/1601 361/679.21 |

FOREIGN PATENT DOCUMENTS

| | | |
|---|---|---|
| JP | 2006-304079 | 11/2006 |
| JP | 2007-156176 | 6/2007 |
| JP | 2009-122274 | 6/2009 |
| JP | 3193326 U | 9/2014 |
| JP | 2014-232323 | 12/2014 |
| JP | 2015-169860 | 9/2015 |

OTHER PUBLICATIONS

Communication pursuant to Rule 164(1) EPC dated Nov. 21, 2017 for the related European Patent Application No. 15872195.1.

* cited by examiner

DISPLAY DEVICE AND STAND

This application is a U.S. national stage application of the PCT International Application No. PCT/JP2015/006217 filed on Dec. 14, 2015, which claims the benefit of foreign priority of Japanese patent application 2014-266517 filed on Dec. 26, 2014, the contents all of which are incorporated herein by reference.

TECHNICAL FIELD

The present disclosure relates to a display device and a stand used for the display device.

BACKGROUND ART

PTL 1 discloses a display device provided with a stand. The stand supports a panel-type display unit having a display screen from below. A conventional stand has a plate-shaped pedestal and a supporting column extending upward from the pedestal. An upper end of the supporting column is fixed to the rear surface of the display unit with a screw or the like.

CITATION LIST

Patent Literature

PTL 1: Unexamined Japanese Patent Publication No. 2007-156176

SUMMARY

The present disclosure provides a display device that can improve design and can stably support a display unit, and a stand used for the display device.

The display device according to the present disclosure includes a display unit provided with a display screen on a front side, and a stand that supports the display unit from below. The stand includes a base which supports the display unit at a rear side of the display unit and extends in a lateral width direction of the display unit, and a pair of legs which supports both longitudinal ends of the base from below respectively and extends across a lower edge of the display unit in a front-rear direction.

The display device according to the present disclosure can improve design and can stably support the display unit.

DESCRIPTION OF EMBODIMENTS

Figure 1:
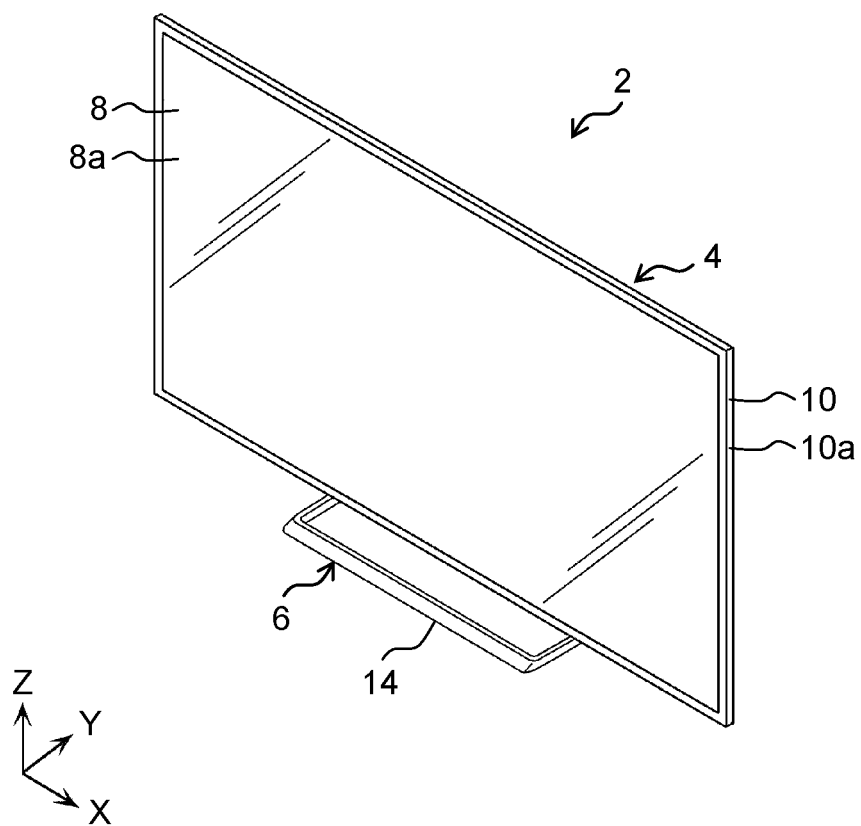
FIG. 1 is a perspective view schematically illustrating one example of a front-side configuration of a display device according to a first exemplary embodiment.

Exemplary embodiments will be described below in detail with reference to the drawings as necessary. However, unnecessarily detailed descriptions may be omitted. For example, detailed descriptions for matters which have already been well known in the art and redundant descriptions for substantially the same configurations may be omitted. This is to prevent the following description from becoming unnecessarily redundant to facilitate understanding of a person skilled in the art.

Note that the accompanying drawings and the following description are provided in order for a person skilled in the art to sufficiently understand the present disclosure, and are not intended to limit the subject matter set forth in the claims.

Furthermore, the respective drawings are schematic, and are not necessarily strictly accurate. In the respective drawings, the same components are identified by the same reference numerals.

First Exemplary Embodiment

A first exemplary embodiment will be described below with reference to FIGS. 1 to 12.

[1-1. Overall Configuration of Display Device]

Firstly, the overall configuration of display device 2 according to the first exemplary embodiment will be described with reference to FIGS. 1 to 4.

FIG. 1 is a perspective view schematically illustrating one example of a front-side configuration of display device 2 according to the first exemplary embodiment.

Figure 2:
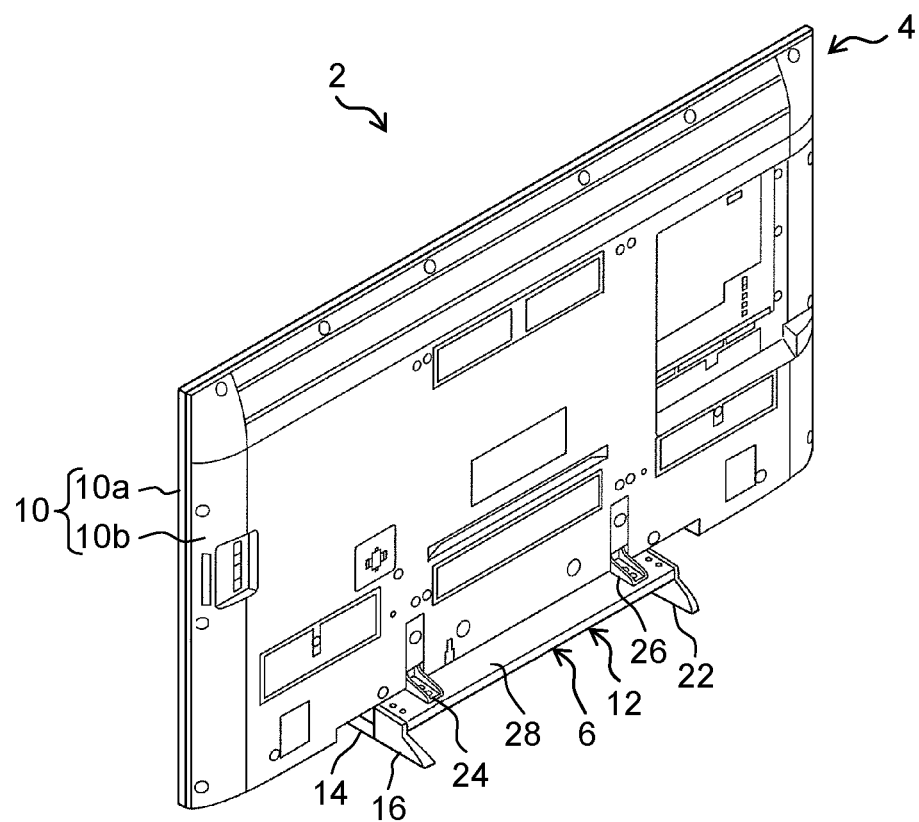
FIG. 2 is a perspective view schematically illustrating one example of a rear-side configuration of the display device according to the first exemplary embodiment.

FIG. 2 is a perspective view schematically illustrating one example of a rear-side configuration of display device 2 according to the first exemplary embodiment.

Figure 3:
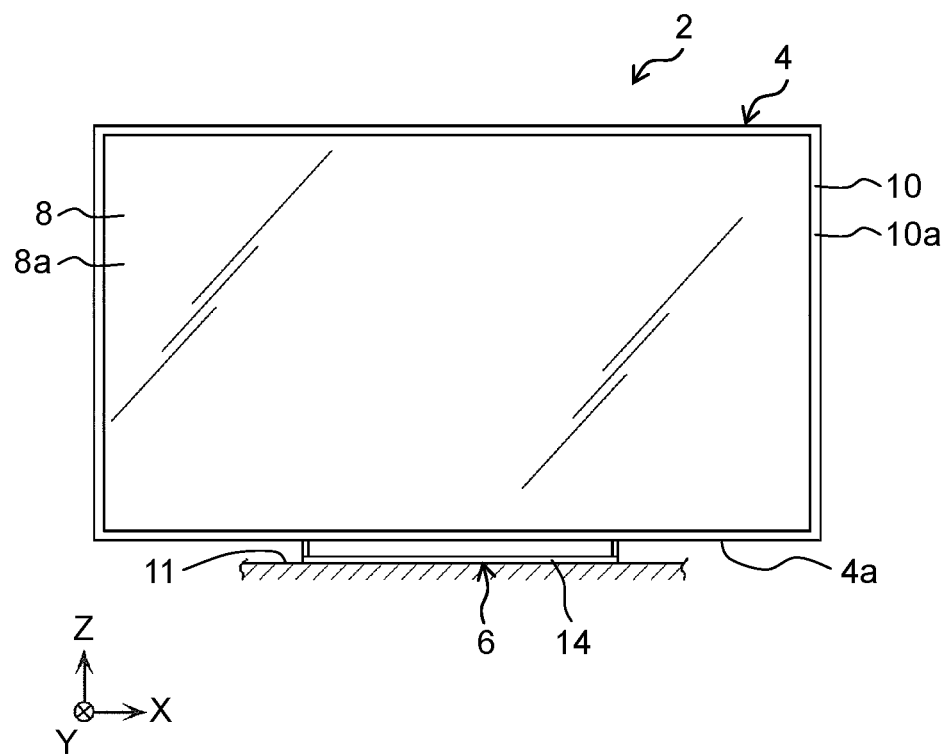
FIG. 3 is a view schematically illustrating one example of the front-side configuration of the display device according to the first exemplary embodiment.

FIG. 3 is a view schematically illustrating one example of the front-side configuration of display device 2 according to the first exemplary embodiment.

Figure 4:
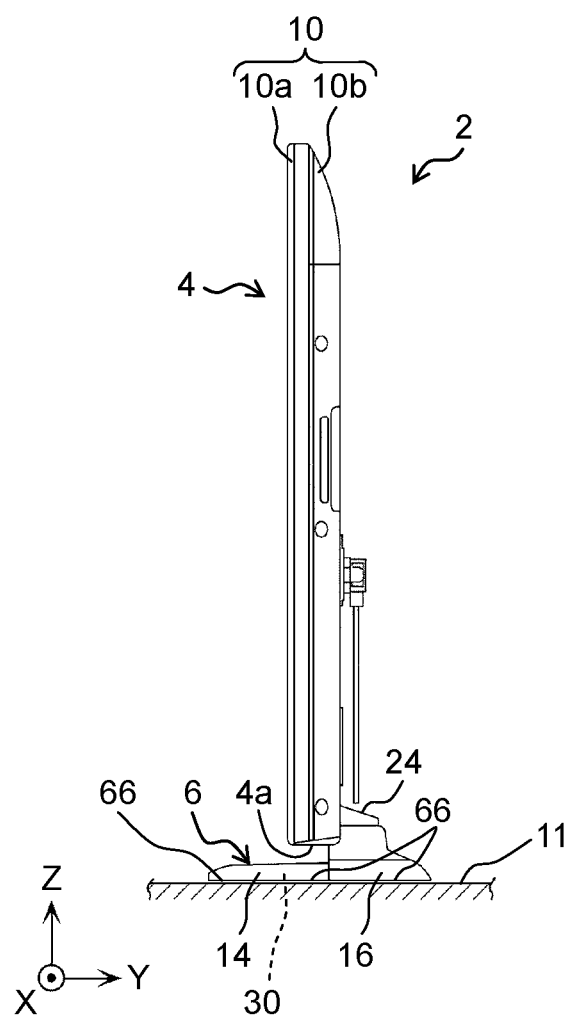
FIG. 4 is a view schematically illustrating one example of a side-face configuration of the display device according to the first exemplary embodiment.

FIG. 4 is a view schematically illustrating one example of a side-face configuration of display device 2 according to the first exemplary embodiment.

In the following description, XYZ axes will be used as needed. For the sake of convenience, in the exemplary embodiment, a direction parallel (substantially parallel) to the longitudinal direction of display device 2 is defined as the X axis, a direction parallel (substantially parallel) to a transverse direction of display device 2 is defined as the Z axis, and a direction orthogonal to both the X axis and the Z axis is defined as the Y axis. In addition, the perpendicular direction with respect to an XY plane, that is, the Z-axis direction is the direction of gravity, and in an ordinary use condition, display device 2 is supposed to be installed on installment plane 11 (see FIGS. 3 and 4) parallel (substantially parallel) to the XY plane. Further, the side facing a user (not illustrated) who views display device 2 is defined as a "front side", the side opposite to the front side is defined as a "rear side", the side relatively distant from installment plane 11 in the Z-axis direction is defined as a "top", and the side relatively close to installment plane 11 in the Z-axis direction is defined as a "bottom".

As illustrated in FIGS. 1 to 4, display device 2 is a liquid crystal television receiver with a flat panel display, for example. Display device 2 includes display unit 4 and stand 6. Note that display device 2 may be a television receiver using organic electro-luminescence (EL) or the like.

Display unit 4 includes liquid crystal panel 8 and housing 10. The overall shape of display unit 4 is formed to be a rectangular flat panel shape.

Liquid crystal panel 8 is mounted in housing 10. As illustrated in FIGS. 1 and 3, display screen 8a on which an image is to be displayed is formed on the front side of liquid crystal panel 8.

Housing 10 has front cabinet 10a and rear cabinet 10b. Front cabinet 10a is formed into a rectangular frame, and disposed to cover an outer peripheral portion of display screen 8a of liquid crystal panel 8. Rear cabinet 10b is disposed to cover the entire rear surface of liquid crystal panel 8, and connected to front cabinet 10a. Thus, display screen 8a of liquid crystal panel 8 is disposed on the front side of display unit 4 as illustrated in FIGS. 1 and 3.

In addition to liquid crystal panel 8 described above, a metal chassis (not illustrated) for supporting liquid crystal panel 8 is disposed in housing 10, for example. The chassis is fixed to the inner surface of rear cabinet 10b, and disposed on the rear side of display unit 4 along with rear cabinet 10b.

Stand 6 supports display unit 4 from below, and is installed on installment plane 11. As illustrated in FIG. 2, stand 6 penetrates rear cabinet 10b to be connected to the above-described chassis (that is, the rear side of display unit 4). In display device 2 according to the exemplary embodiment, the configuration of stand 6 has characteristic features. The configuration of stand 6 will be described later.

[1-2. Configuration of Stand]

Next, the configuration of stand 6 according to the first exemplary embodiment will be described with reference to FIGS. 1 to 12.

Figure 5:
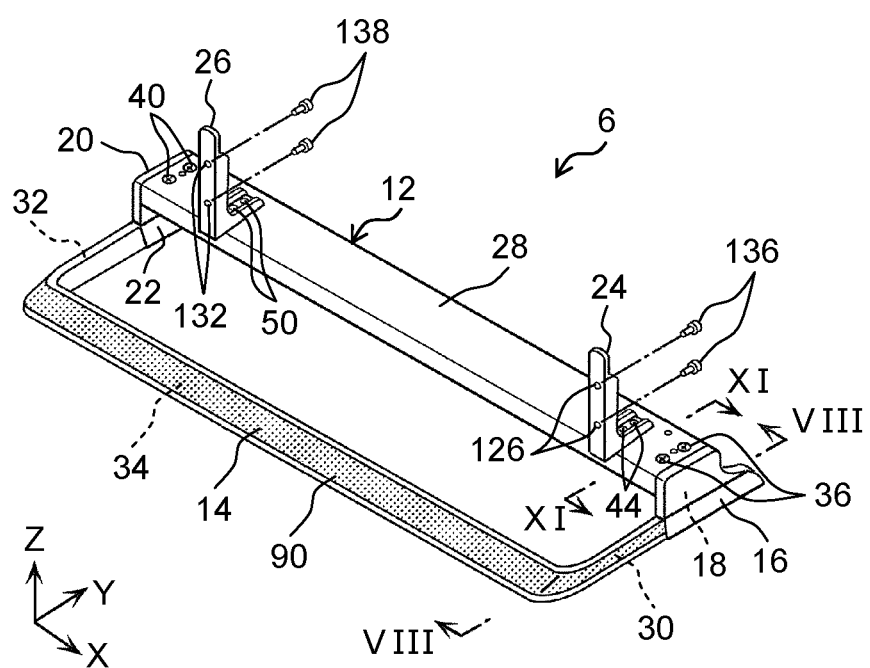
FIG. 5 is a perspective view schematically illustrating one example of a configuration of a stand according to the first exemplary embodiment.

FIG. 5 is a perspective view schematically illustrating one example of the configuration of stand 6 according to the first exemplary embodiment.

Figure 6:
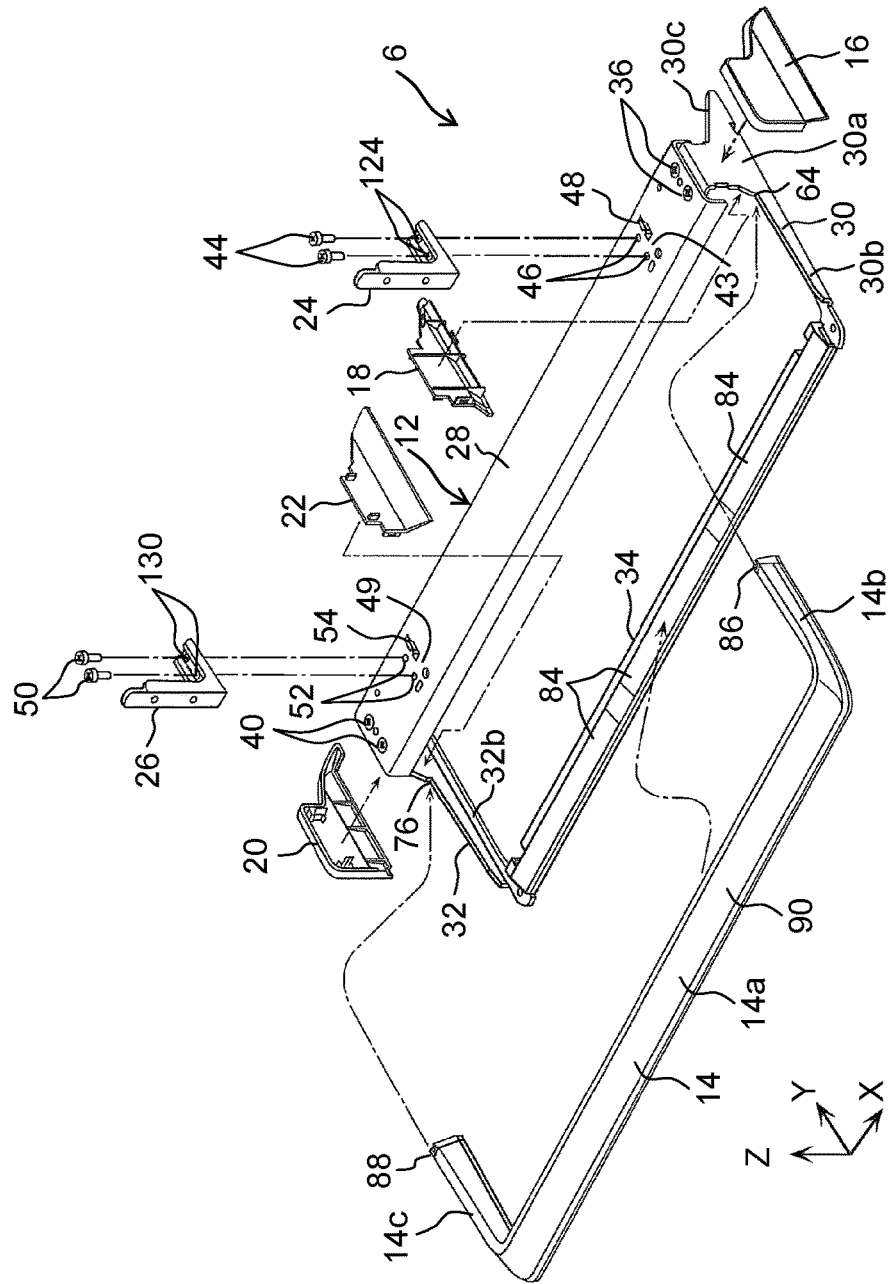
FIG. 6 is an exploded perspective view schematically illustrating the state in which the stand according to the first exemplary embodiment is partially exploded.

FIG. 6 is an exploded perspective view schematically illustrating the state in which stand 6 according to the first exemplary embodiment is partially exploded.

Figure 7:
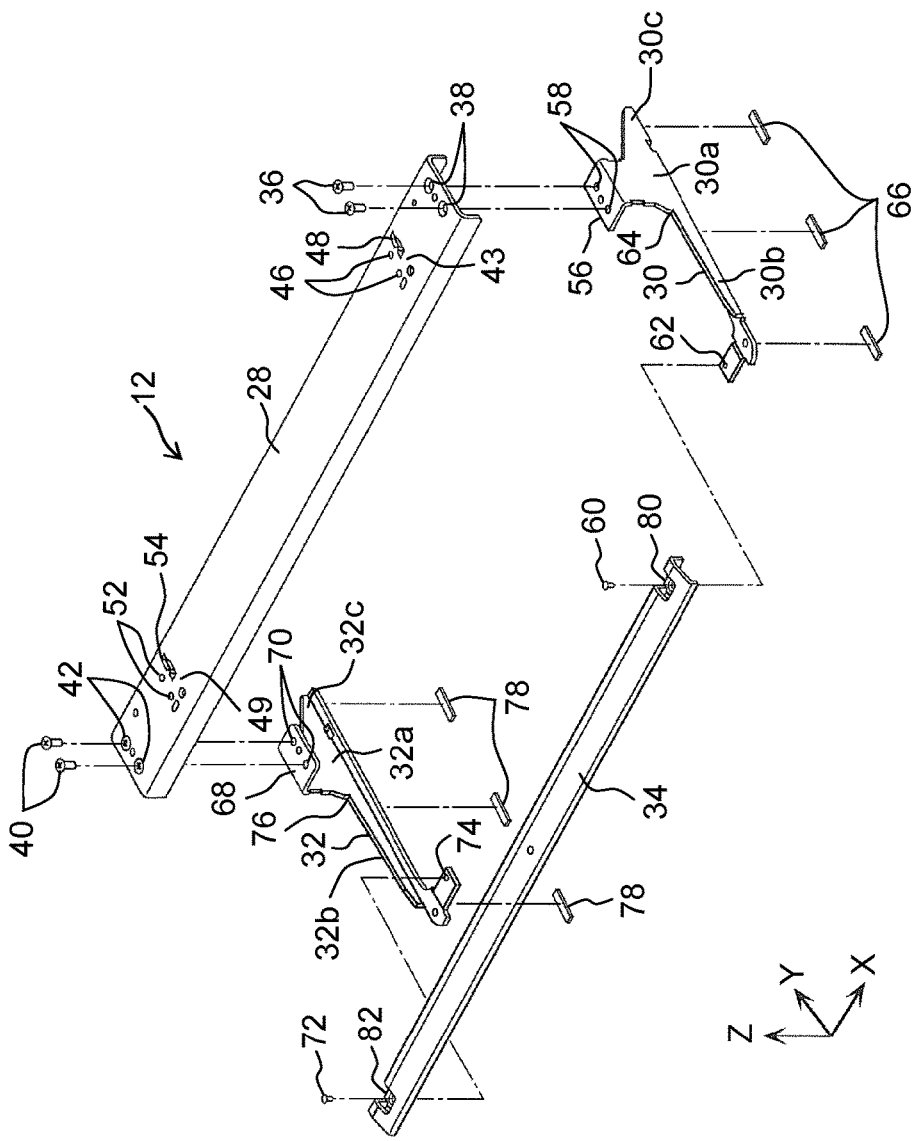
FIG. 7 is an exploded perspective view schematically illustrating the state in which a frame of the stand according to the first exemplary embodiment is exploded.

FIG. 7 is an exploded perspective view schematically illustrating the state in which frame 12 of stand 6 according to the first exemplary embodiment is exploded.

Figure 8:
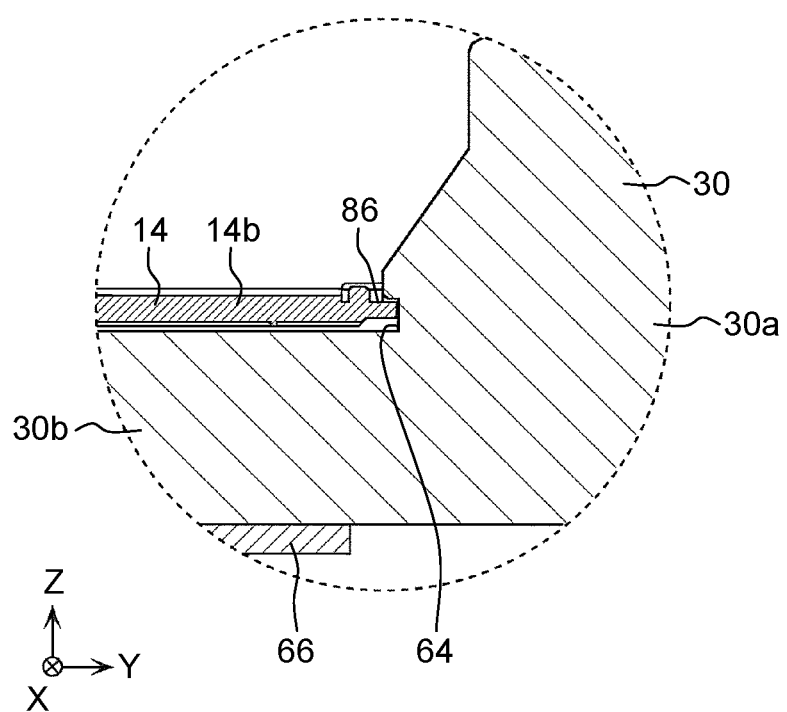
FIG. 8 is a partial sectional view schematically illustrating a part of a cross-section along VIII-VIII in FIG. 5.

FIG. 8 is a partial sectional view schematically illustrating a part of a cross-section along VIII-VIII in FIG. 5.

Figure 9:
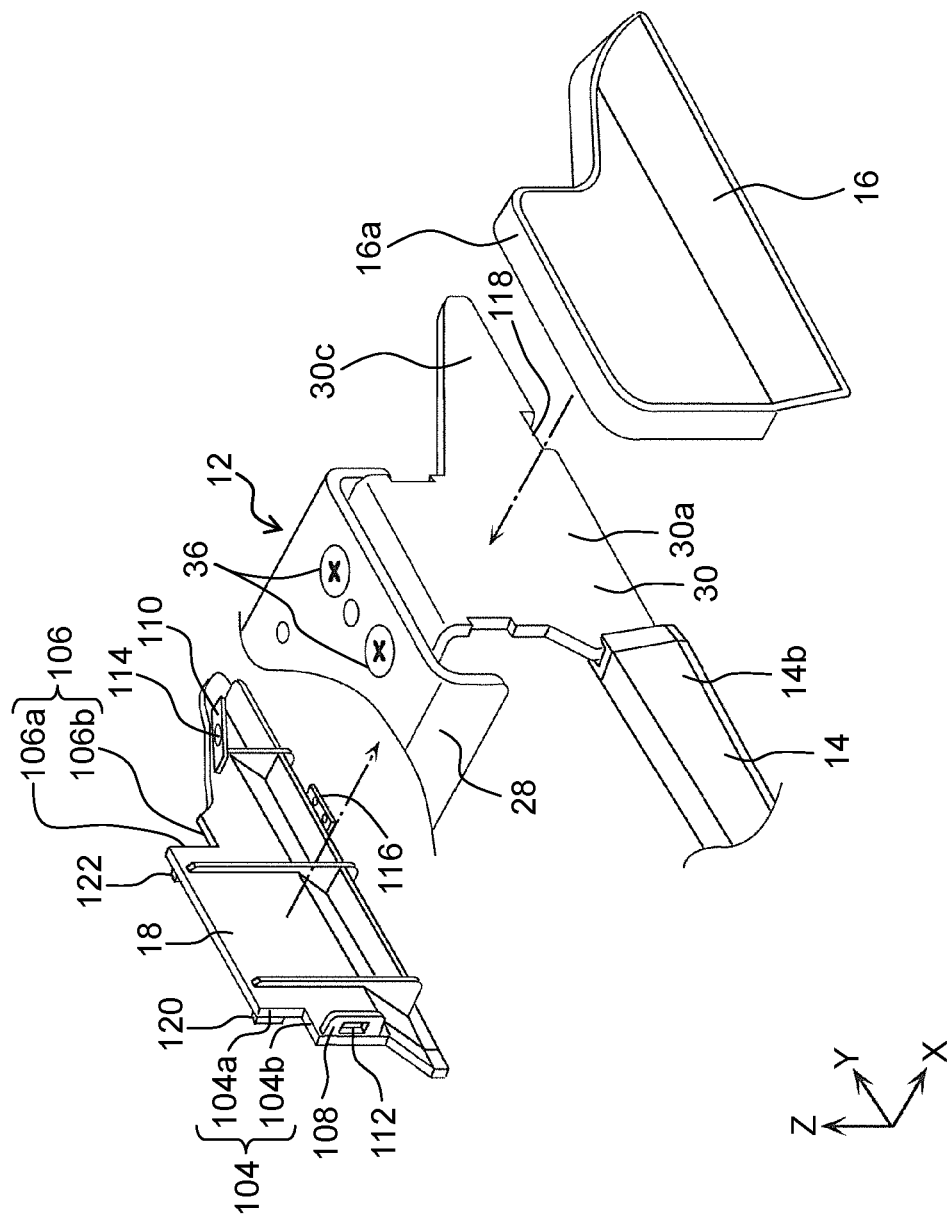
FIG. 9 is an exploded perspective view illustrating a part of FIG. 6 in an enlarged manner.

FIG. 9 is an exploded perspective view illustrating a part of FIG. 6 in an enlarged manner.

Figure 10:
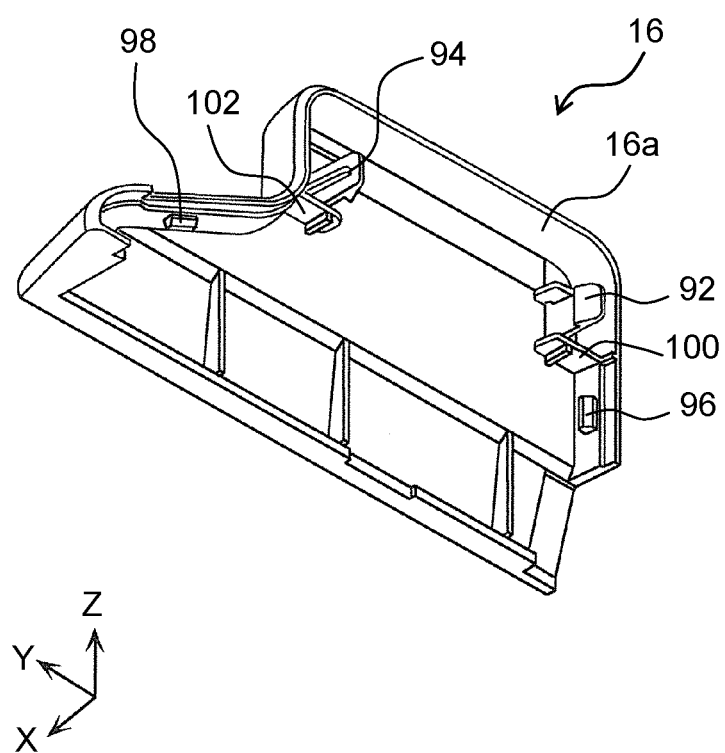
FIG. 10 is a perspective view schematically illustrating one example of a configuration of a first external cover member of the stand according to the first exemplary embodiment.

FIG. 10 is a perspective view schematically illustrating one example of a configuration of first external cover member 16 of stand 6 according to the first exemplary embodiment.

Figure 11:
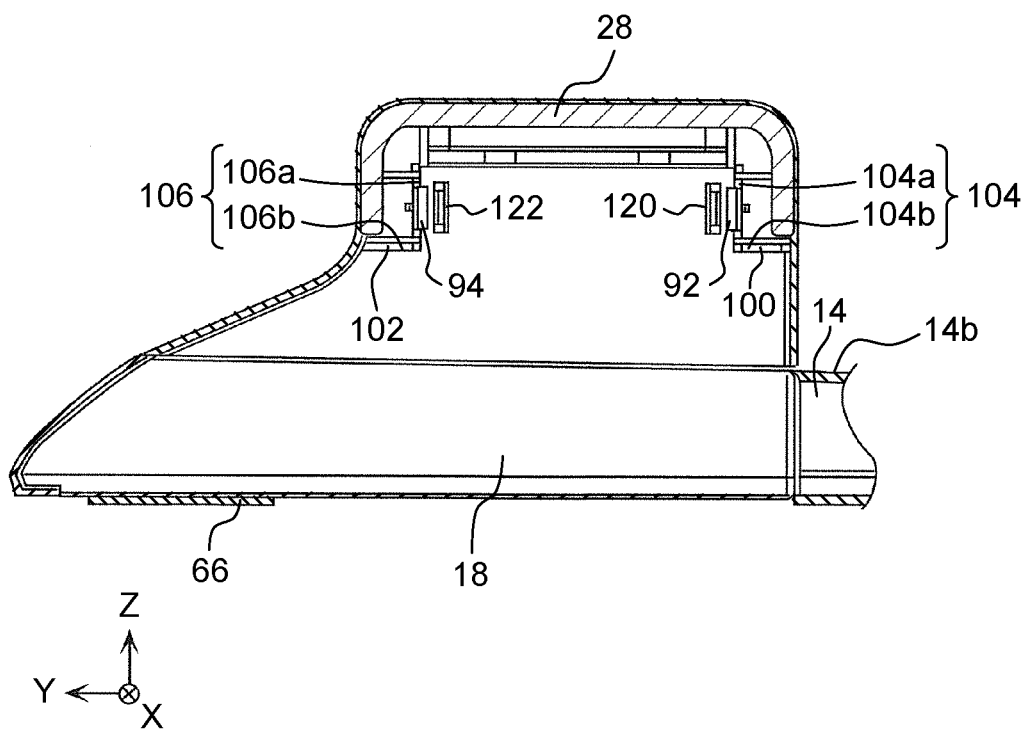
FIG. 11 is a sectional view schematically illustrating a cross-section along XI-XI in FIG. 5.

FIG. 11 is a sectional view schematically illustrating a cross-section along XI-XI in FIG. 5.

Figure 12:
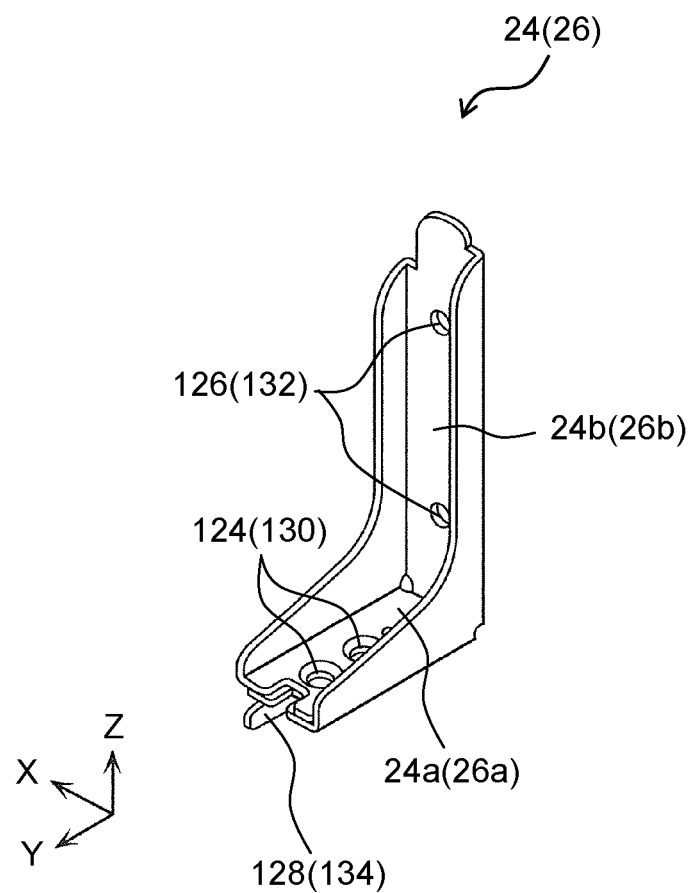
FIG. 12 is a perspective view schematically illustrating one example of a configuration of a connection fitting of the stand according to the first exemplary embodiment.

FIG. 12 is a perspective view schematically illustrating one example of a configuration of connection fitting 24 (26) of stand 6 according to the first exemplary embodiment.

As illustrated in FIGS. 5 and 6, stand 6 includes frame 12, front-side cover member 14, first external cover member 16, first internal cover member 18, second external cover member 20, second internal cover member 22, and the pair of connection fittings 24, 26. The pair of connection fittings 24, 26 is one example of a pair of connection members.

[1-2-1. Configuration of Frame]

As illustrated in FIGS. 6 and 7, frame 12 includes base 28, a pair of legs 30, 32, and connection portion 34. Base 28, the pair of legs 30, 32, and connection portion 34 are combined such that the entire shape of frame 12 becomes substantially rectangle. Note that frame 12 is formed of a plate made of iron, aluminum, or copper, for example.

As illustrated in FIGS. 5 to 7, base 28 is formed to linearly extend in a longitudinal direction that is the lateral width direction (X-axis direction) of display unit 4. Notably, in the state in which stand 6 is connected to the rear side of display unit 4, base 28 is disposed on the position facing the rear side of display unit 4, as illustrated in FIGS. 2 and 4.

Form of the cross-section of base 28 in the direction perpendicular to the longitudinal direction has substantially a C shape (i.e., the shape in which one of long sides (on the side facing the installment plane 11) of a rectangle is open) (see FIGS. 7 and 9). A pair of insertion holes 38 into which screws 36 are inserted is formed near one end of base 28 in the longitudinal direction (X-axis direction) (see FIG. 7). In addition, a pair of insertion holes 42 into which screws 40 are inserted is formed near the other end of base 28 in the longitudinal direction.

Fixing portion 43 for fixing connection fitting 24 is disposed at an intermediate position between one end and the central part of base 28 in the longitudinal direction. Fixing portion 43 is provided with a pair of screw holes 46 into which screws 44 are screwed and through-hole 48 to which hook 128 (see FIG. 12 described later) of connection fitting 24 is fitted. In addition, fixing portion 49 for fixing connection fitting 26 is disposed at an intermediate position between the other end and the central part of base 28 in the longitudinal direction. Fixing portion 49 is provided with a pair of screw holes 52 into which screws 50 are screwed and through-hole 54 to which hook 134 (see FIG. 12 described later) of connection fitting 26 is fitted.

As illustrated in FIGS. 6 and 7, the pair of legs 30, 32 is detachably fixed to both longitudinal ends of base 28.

Leg 30 is fixed to one longitudinal end of base 28 with a pair of screws 36. Leg 30 includes main body part 30a, front-side protruding part 30b linearly protruding to the front side of display unit 4 from main body part 30a, and back-side protruding part 30c protruding to the rear side of display unit 4 from main body part 30a in substantially a triangular shape. An amount of protrusion of front-side protruding part 30b from main body part 30a is approximately twice an amount of protrusion of back-side protruding part 30c from main body part 30a.

Support portion 56 that is almost perpendicularly bent toward the inner side (toward base 28) is provided on an upper end of main body part 30a. Support portion 56 is provided to support one longitudinal end of base 28 from below. A pair of screw holes 58 into which screws 36 are screwed is formed on support portion 56. Since screws 36 are screwed into screw holes 58 through insertion holes 38 on base 28, leg 30 is fixed to one longitudinal end of base 28. Thus, leg 30 is disposed such that the direction substantially perpendicular to the longitudinal direction (X-axis direction) of base 28 (that is, the direction crossing the longitudinal direction of base 28, i.e., Y-axis direction) is defined as a longitudinal direction.

Screw hole 62 into which screw 60 is screwed is formed on a tip of front-side protruding part 30b. In addition, as illustrated in FIGS. 6 to 8, recess 64 is formed on the boundary between main body part 30a and front-side protruding part 30b on the outer peripheral edge of leg 30. As illustrated in FIG. 7, a plurality of anti-slip rubber feet 66 is attached on the lower surface (that is, the face facing installment plane 11 for stand 6) of leg 30 with a space therebetween in the longitudinal direction (Y-axis direction) of leg 30. That is, leg 30 is installed on installment plane 11 through the plurality of rubber feet 66.

As illustrated in FIGS. 6 and 7, leg 32 is fixed to the other longitudinal end of base 28 with a pair of screws 40. Leg 32 is bilaterally symmetrical to above-described leg 30 in shape. Specifically, leg 32 includes main body part 32a, front-side protruding part 32b linearly protruding to the front side of display unit 4 from main body part 32a, and back-side protruding part 32c protruding to the rear side of display unit 4 from main body part 32a in substantially a triangular shape. An amount of protrusion of front-side protruding part 32b from main body part 32a is approximately twice an amount of protrusion of back-side protruding part 32c from main body part 32a.

Support portion 68 that is formed to be almost perpendicularly bent toward the inner side (toward base 28) is provided on an upper end of main body part 32a. Support portion 68 is provided to support the other longitudinal end of base 28 from below. A pair of screw holes 70 into which screws 40 are screwed is formed on support portion 68. Since screws 40 are screwed into screw holes 70 through insertion holes 42 on base 28, leg 32 is fixed to the other longitudinal end of base 28. Thus, leg 32 is disposed such that the direction (Y-axis direction) substantially perpendicular to the longitudinal direction (X-axis direction) of base 28 is defined as a longitudinal direction.

Screw hole 74 into which screw 72 is screwed is formed on a tip of front-side protruding part 32b. In addition, as illustrated in FIGS. 6 and 7, recess 76 is formed on the boundary between main body part 32a and front-side protruding part 32b on the outer peripheral edge of leg 32. As illustrated in FIG. 7, a plurality of anti-slip rubber feet 78 is attached on the lower surface of leg 32 with a space therebetween in the longitudinal direction (Y-axis direction) of leg 32. That is, leg 32 is installed on installment plane 11 through the plurality of rubber feet 78.

As illustrated in FIG. 4, in the state in which stand 6 is connected to the rear side of display unit 4, each of the pair of legs 30, 32 is disposed to extend across lower edge 4a of display unit 4 in a front-rear direction (Y-axis direction). Specifically, front-side protruding parts 30b, 32b protrude toward the front side of display unit 4, while back-side protruding parts 30c, 32c protrude toward the back side of display unit 4.

As illustrated in FIGS. 6 and 7, connection portion 34 connects ends (tips of front-side protruding parts 30b, 32b) of the respective legs 30, 32 on the front side of display unit 4 to each other. Connection portion 34 is formed to linearly extend in the longitudinal direction that is the lateral width direction (X-axis direction) of display unit 4. Insertion hole 80 into which screw 60 is inserted is formed on one end of connection portion 34 in the longitudinal direction (X-axis direction). Since screw 60 is screwed into screw hole 62 on leg 30 through insertion hole 80, one longitudinal end of connection portion 34 is fixed to the tip of front-side protruding part 30b of leg 30. Further, insertion hole 82 into which screw 72 is inserted is formed on the other end of connection portion 34 in the longitudinal direction (X-axis direction). Since screw 72 is screwed into screw hole 74 on leg 32 through insertion hole 82, the other longitudinal end of connection portion 34 is fixed to the tip of front-side protruding part 32b of leg 32.

Note that stand 6 is configured such that connection portion 34 is not in contact with installment plane 11 on which stand 6 is installed. That is, connection portion 34 is not in contact with installment plane 11 of stand 6, but separated from installment plane 11 of stand 6 by, for example, about 1 mm to 2 mm. Thus, the weight of display unit 4 is supported by the pair of legs 30, 32.

In the case where the size (inch) of display screen 8a is relatively large, the amount of protrusion of back-side protruding part 30c from main body part 30a may further be increased in order to more stably support display unit 4.

[1-2-2. Configuration of Front-Side Cover Member]

As illustrated in FIGS. 5 and 6, front-side cover member 14 is to decorate frame 12, and formed of resin, for example. Front-side cover member 14 includes main body part 14a linearly extending in the X-axis direction, and a pair of extension parts 14b, 14c extending substantially perpendicularly (in the Y-axis direction) from both longitudinal ends of main body part 14a.

Main body part 14a is disposed to cover connection portion 34 from outside of stand 6, and is fixed to connection portion 34 with, for example, a plurality of double-face adhesive tapes 84. Each of the pair of extension parts 14b, 14c is disposed to cover front-side protruding part 30b of leg 30 and front-side protruding part 32b of leg 32 from outside of stand 6.

Furthermore, claw 86 is formed at the tip of extension part 14b, and claw 88 is formed at the tip of extension part 14c. As illustrated in FIGS. 6 and 8, claw 86 is engaged with recess 64 on leg 30, and claw 88 is engaged with recess 76 on leg 32.

To fix front-side cover member 14 to frame 12, a pair of claws 86, 88 is firstly engaged with recess 64 on leg 30 and recess 76 on leg 32 respectively with main body part 14a being separated from the surface of connection portion 34. Then, main body part 14a is made close to the surface of connection portion 34, and is pressed onto the plurality of double-face adhesive tapes 84 attached on the surface of connection portion 34.

Furthermore, as illustrated in FIGS. 5 and 6, mirror surface 90 is formed on the surface of front-side cover member 14, specifically, on the surfaces of each of main body part 14*a* and the pair of extension parts 14*b*, 14*c*. Mirror surface 90 is indicated by a hatched region in FIG. 5. Mirror surface 90 is formed by, for example, thermally transferring a metal foil onto the surface of front-side cover member 14.

[1-2-3. Configuration of First External Cover Member and First Internal Cover Member]

As illustrated in FIGS. 5, 6, and 9, each of first external cover member 16, first internal cover member 18, second external cover member 20, and second internal cover member 22 is to decorate frame 12, similarly to front-side cover member 14 described above, and are formed of resin, for example.

As illustrated in FIGS. 5, 6, and 9, first external cover member 16 is disposed to cover main body part 30*a* and back-side protruding part 30*c* of leg 30 from outside of stand 6 (from the side opposite to the side where base 28 is disposed). First internal cover member 18 is disposed to cover main body part 30*a* and back-side protruding part 30*c* of leg 30 from inside of stand 6 (from the side where base 28 is disposed). Specifically, first external cover member 16 and first internal cover member 18 are disposed to hold main body part 30*a* and back-side protruding part 30*c* of leg 30 from both sides.

As illustrated in FIGS. 5 and 6, second external cover member 20 is disposed to cover main body part 32*a* and back-side protruding part 32*c* of leg 32 from outside of stand 6 (from the side opposite to the side where base 28 is disposed). Second internal cover member 22 is disposed to cover main body part 32*a* and back-side protruding part 32*c* of leg 32 from inside of stand 6 (from the side where base 28 is disposed). Specifically, second external cover member 20 and second internal cover member 22 are disposed to hold main body part 32*a* and back-side protruding part 32*c* of leg 32 from both sides.

First external cover member 16 and first internal cover member 18 are almost bilaterally symmetrical in shape to second external cover member 20 and second internal cover member 22, respectively. Therefore, only the configurations of first external cover member 16 and first internal cover member 18 will be described below, and the description of second external cover member 20 and second internal cover member 22 will be omitted.

As illustrated in FIG. 10, a pair of claws 92, 94 extending toward first internal cover member 18, which is disposed on the opposite position across main body part 30*a*, is formed on the inner surface of first external cover member 16. The pair of claws 92, 94 is disposed with a space therebetween in the Y-axis direction. Bent part 16*a* bent toward first internal cover member 18, which is disposed on the opposite position across main body part 30*a*, is formed on the outer peripheral edge of first external cover member 16. A pair of claws 96, 98 is formed on the inner surface of bent part 16*a*. In addition, a pair of guide portions 100, 102 is formed on the inner surface of bent part 16*a*. The pair of guide portions 100, 102 extends in the Y-axis direction so as to face each other.

As illustrated in FIG. 9, a pair of substantially rectangular cutouts 104, 106 (one example of an engaged portion) is formed on the outer peripheral edge of first internal cover member 18. Cutout 104 has perpendicular part 104*a* extending in the Z-axis direction and horizontal part 104*b* extending in the Y-axis direction. Cutout 106 has perpendicular part 106*a* extending in the Z-axis direction and horizontal part 106*b* extending in the Y-axis direction. As illustrated in FIG. 11, the pair of guide portions 100, 102 on first external cover member 16, which is disposed on the opposite position across main body part 30*a*, is guided along a pair of horizontal parts 104*b*, 106*b*, respectively. Thus, first external cover member 16 is positioned with respect to first internal cover member 18. In addition, the pair of claws 92, 94 on first external cover member 16, which is disposed on the opposite position across main body part 30*a*, is engaged with a pair of perpendicular parts 104*a*, 106*a*, respectively.

A pair of engagement pieces 108, 110 extending toward first external cover member 16, which is disposed on the opposite position across main body part 30*a*, is further formed on the outer peripheral edge of first internal cover member 18. A pair of holes 112, 114 (one example of an engaged portion) is formed on the pair of engagement pieces 108, 110. The pair of claws 96, 98 on first external cover member 16, which is disposed on the opposite position across main body part 30*a*, is engaged with the pair of holes 112, 114, respectively.

Further, hook 116 extending toward first external cover member 16, which is disposed on the opposite position across main body part 30*a*, is formed on the outer peripheral edge of the lower end of first internal cover member 18. As illustrated in FIG. 9, hook 116 is engaged with recess 118 formed on the lower end of back-side protruding part 30*c* of leg 30.

As illustrated in FIGS. 9 and 11, a pair of projections 120, 122 is formed on the outer surface (that is, the surface on the opposite side of first external cover member 16) of first internal cover member 18. The pair of projections 120, 122 is formed near the pair of perpendicular parts 104*a*, 106*a*, respectively. Specifically, projection 120 is disposed near claw 92 engaged with perpendicular part 104*a*, and projection 122 is disposed near claw 94 engaged with perpendicular part 106*a*.

[1-2-4. Configuration of Connection Fitting]

As illustrated in FIGS. 5 and 6, the pair of connection fittings 24, 26 is disposed on base 28 with a space therebetween in the longitudinal direction. Each of the pair of connection fittings 24, 26 is an L-shaped connection fitting that connects base 28 to the rear side of display unit 4.

As illustrated in FIGS. 5 and 12, a pair of insertion holes 124 into which screws 44 are inserted is formed on one side 24*a* of connection fitting 24. A pair of insertion holes 126 into which screws 136 are inserted is formed on the other side 24*b* of connection fitting 24. Other side 24*b* of connection fitting 24 is also provided with hook 128 that protrudes downward.

As illustrated in FIG. 6, connection fitting 24 is fixed to fixing portion 43 of base 28 in such a manner that hook 128 (see FIG. 12) is engaged with through-hole 48 of base 28 and screws 44 are screwed into screw holes 46 on base 28 through insertion holes 124.

As illustrated in FIGS. 5 and 12, a pair of insertion holes 130 into which screws 50 are inserted is formed on one side 26*a* of connection fitting 26. A pair of insertion holes 132 into which screws 138 are inserted is formed on the other side 26*b* of connection fitting 26. Other side 26*b* of connection fitting 26 is also provided with hook 134 that protrudes downward.

As illustrated in FIG. 6, connection fitting 26 is fixed to fixing portion 49 of base 28 in such a manner that hook 134 (see FIG. 12) is engaged with through-hole 54 of base 28 and screws 50 are screwed into screw holes 52 on base 28 through insertion holes 130.

As illustrated in FIG. 5, screws 136 are screwed into the chassis of display unit 4 (not illustrated in FIG. 5) through insertion holes 126 of connection fitting 24, and screws 138 are screwed into the chassis of display unit 4 through insertion holes 132 of connection fitting 26. Thus, base 28 and the rear side of display unit 4 are connected to each other with the pair of connection fittings 24, 26. Specifically, the rear side of display unit 4 is supported by base 28 through the pair of connection fittings 24 and 26, whereby display unit 4 is supported on base 28. Note that, as illustrated in FIG. 2, each of other side 24b of connection fitting 24 and other side 26b of connection fitting 26 is covered by a part of rear cabinet 10b.

[1-3. Effects and the Like]

As described above, in the exemplary embodiment, a display device includes a display unit provided with a display screen on a front side, and a stand that supports the display unit from below. The stand includes a base which supports the display unit at a rear side of the display unit and extends in a lateral width direction of the display unit, and a pair of legs which supports both longitudinal ends of the base from below respectively and extends across a lower edge of the display unit in a front-rear direction.

In addition, in the exemplary embodiment, a stand is a stand to support a display unit having a display screen from below, and includes a base which extends in one direction and supports the display unit at a rear side of the display unit, and a pair of legs which supports both longitudinal ends of the base from below respectively and extends in a direction crossing a longitudinal direction of the base.

Note that, display device 2 is one example of the display device. Display screen 8a is one example of the display screen. Display unit 4 is one example of the display unit. Stand 6 is one example of the stand. Base 28 is one example of the base. Lower edge 4a is one example of the lower edge. The pair of legs 30, 32 is one example of the pair of legs.

For example, in the configuration example of display device 2 described in the first exemplary embodiment, display device 2 includes display unit 4 provided with display screen 8a on a front side, and stand 6 that supports display unit 4 from below. Stand 6 includes base 28 which supports display unit 4 at the rear side of display unit 4 and extends in the lateral width direction of display unit 4, and the pair of legs 30, 32 which supports both longitudinal ends of base 28 from below respectively and extends across lower edge 4a of display unit 4 in the front-rear direction.

In addition, stand 6 described in the first exemplary embodiment is to support display unit 4 having display screen 8a from below. Stand 6 includes base 28 which extends in one direction (the lateral width direction of display unit 4, X-axis direction) and supports display unit 4 at the rear side of display unit 4, and the pair of legs 30, 32 which supports both longitudinal ends of base 28 from below respectively and extends in the direction crossing the longitudinal direction of base 28.

With this configuration, when a user views display device 2 from front, there is a space where nothing is present between the pair of legs 30, 32 as illustrated in FIG. 3, and thus, the user can feel as if display unit 4 are floating in the air. Accordingly, this configuration can prevent stand 6 from being more visible than display unit 4, thereby improving the design of display device 2. Further, base 28 supports display unit 4, and the pair of legs 30, 32 supports both longitudinal ends of base 28 from below, whereby display unit 4 can stably be supported.

In the exemplary embodiment, the stand may include a pair of connection members which is disposed on the base at an interval in a longitudinal direction of the base to connect the base and a rear side of the display unit.

Note that the pair of connection fittings 24, 26 is one example of the pair of connection members.

For example, in the configuration example of display device 2 described in the first exemplary embodiment, stand 6 has the pair of connection fittings 24, 26 which is disposed on base 28 with a space therebetween in the longitudinal direction of base 28 for connecting base 28 and the rear side of display unit 4.

With this configuration, display unit 4 can be supported on base 28 at the rear side of display unit 4 with the pair of connection fittings 24, 26.

In the exemplary embodiment, the pair of legs may be detachably fixed to both the longitudinal ends of the base, respectively.

Note that the pair of legs 30, 32 is one example of the pair of legs.

For example, in the configuration example of display device 2 described in the first exemplary embodiment, the pair of legs 30, 32 is detachably fixed to both longitudinal ends of base 28, respectively.

With this configuration, if base 28 with a length corresponding to the size of display screen 8a is prepared in manufacturing display device 2, a part of display device 2 can be manufactured by fixing the pair of legs 30, 32 to both longitudinal ends of base 28 respectively. Thus, in assembling stand 6, some components (the pair of legs 30, 32) of stand 6 can be commonly used for manufacturing display devices 2 having display screens 8a of different sizes, whereby display devices 2 can be manufactured more efficiently.

In the exemplary embodiment, the stand may include an external cover member that covers the leg from outside of the stand, and an internal cover member that covers the leg from inside of the stand to interpose the leg between the internal cover member and the external cover member.

Note that first external cover member 16 and second external cover member 20 are respectively one example of the external cover member. First internal cover member 18 and second internal cover member 22 are respectively one example of the internal cover member.

For example, in the configuration example of display device 2 described in the first exemplary embodiment, stand 6 includes first external cover member 16 that covers leg 30 from outside of stand 6, and first internal cover member 18 that covers leg 30 from inside of stand 6 to hold leg 30 with first external cover member 16. Furthermore, stand 6 includes second external cover member 20 that covers leg 32 from outside of stand 6, and second internal cover member 22 that covers leg 32 from inside of stand 6 to hold leg 32 with second external cover member 20.

With this configuration, frame 12 formed of a plate can be decorated.

In the exemplary embodiment, one of the external cover member and the internal cover member may have a claw, and the other of the external cover member and the internal cover member may have an engaged portion with which the claw is engaged.

Note that each of first external cover member 16 and second external cover member 20 is one example of one of the external cover member and the internal cover member. Each of first internal cover member 18 and second internal cover member 22 is one example of the other of the external cover member and the internal cover member. Each of claws 92, 94, 96, 98 is one example of the claw. Each of cutouts 104, 106 and holes 112, 114 is one example of the engaged portion.

For example, in the configuration example of display device 2 described in the first exemplary embodiment, first external cover member 16 has claws 92, 94, and first internal cover member 18 has cutout 104 with which claw 92 is engaged and cutout 106 with which claw 94 is engaged. Furthermore, first external cover member 16 has claws 96, 98, and first internal cover member 18 has hole 112 with which claw 96 is engaged and hole 114 with which claw 98 is engaged.

With this configuration, in display device 2, first external cover member 16 and first internal cover member 18 can be fixed to each other without using screws or the like. This configuration prevents the exposure of the head of a screw or the like on the surface of each of first external cover member 16 and first internal cover member 18. Accordingly, the design of display device 2 can further be improved.

In the exemplary embodiment, the engaged portion may be a cutout formed on an outer peripheral edge of the other of the external cover member and the internal cover member. The other of the external cover member and the internal cover member may further have a projection formed near a tip of the claw engaged with the cutout.

Note that each of cutouts 104, 106 is one example of the cutout. Each of claws 92, 94 is one example of the claw. Each of projections 120, 122 is one example of the projection.

For example, in the configuration example of display device 2 described in the first exemplary embodiment, claw 92 is engaged with cutout 104 formed on the outer peripheral edge of first internal cover member 18, and claw 94 is engaged with cutout 106 formed on the outer peripheral edge of first internal cover member 18. Furthermore, first internal cover member 18 has projection 120 formed near the tip of claw 92 engaged with cutout 104, and projection 122 formed near the tip of claw 94 engaged with cutout 106.

This configuration can prevent a user from touching the tip of claw 92 or claw 94 with his/her hands when the user lifts up display device 2, for example. Thus, an accidental disengagement between claw 92 and cutout 104 or an accidental disengagement between claw 94 and cutout 106 can be prevented.

In the exemplary embodiment, the stand may further include a connection portion that connects the end of each of the pair of legs on the front side of the display unit to each other.

Note that connection portion 34 is one example of the connection portion.

For example, in the configuration example of display device 2 described in the first exemplary embodiment, stand 6 includes connection portion 34 that connects the end of each of the pair of legs 30, 32 on the front side of display unit 4 to each other.

Thus, rigidity of stand 6 can be enhanced.

In the exemplary embodiment, the stand may further include a front-side cover member that covers each of the connection portion and the pair of legs from outside of the stand.

Note that front-side cover member 14 is one example of the front-side cover member.

For example, in the configuration example of display device 2 described in the first exemplary embodiment, stand 6 includes front-side cover member 14 that covers each of connection portion 34 and the pair of legs 30, 32 from outside of stand 6.

With this configuration, frame 12 formed of a plate can be decorated.

In the exemplary embodiment, a mirror surface may be formed on a surface of the front-side cover member.

Note that mirror surface 90 is one example of the mirror surface.

For example, in the configuration example of display device 2 described in the first exemplary embodiment, mirror surface 90 is formed on the surface of front-side cover member 14.

With this configuration, the surrounding view of display device 2 is reflected in mirror surface 90, which can provide a visual effect in which stand 6 fits into the surrounding view of display device 2. Accordingly, this configuration can more effectively prevent stand 6 from being more visible than display unit 4.

First Modification Example of First Exemplary Embodiment

[2-1. Configuration of Stand]

Next, the configuration of stand 6A according to a first modification example of the first exemplary embodiment will be described with reference to FIG. 13.

Figure 13:
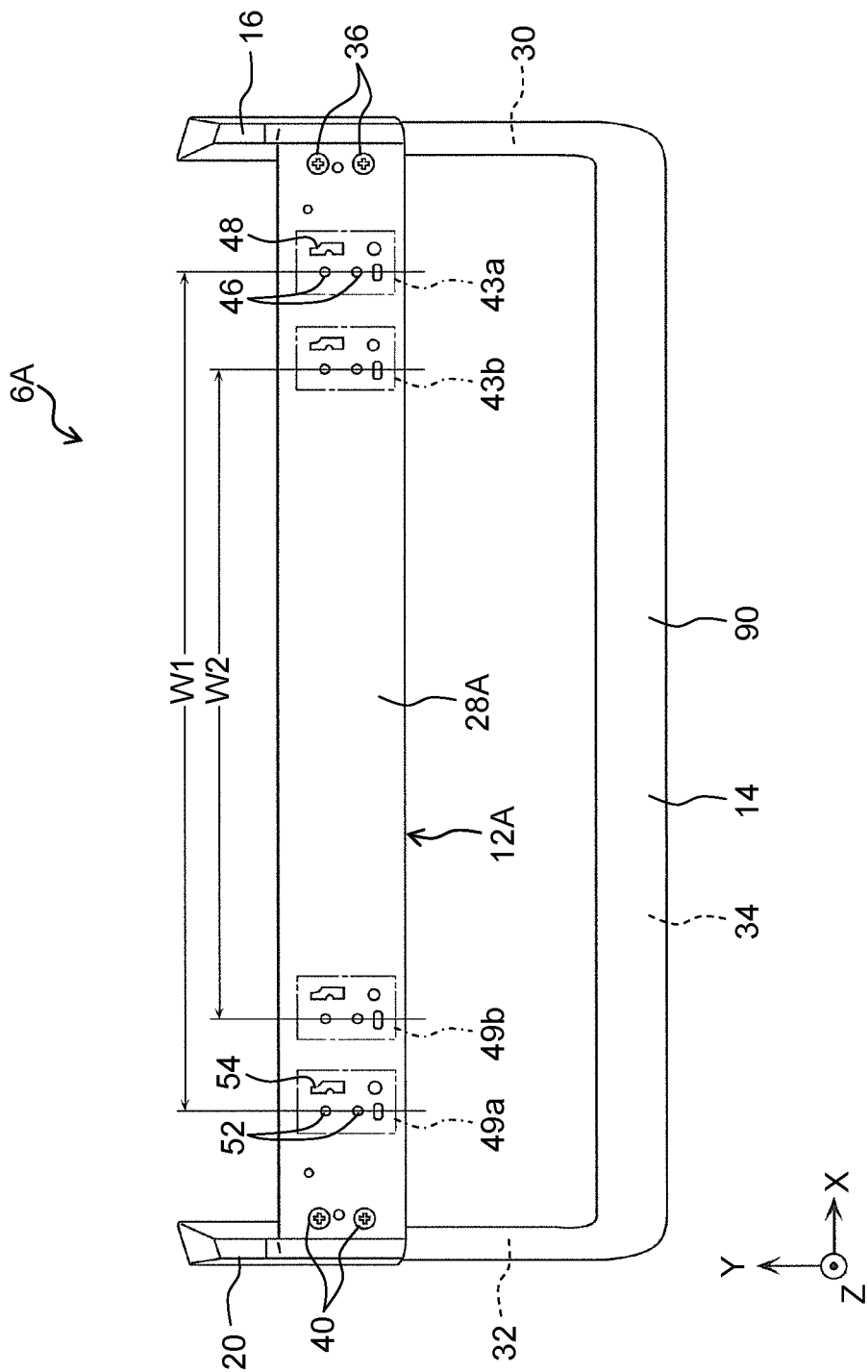
FIG. 13 is a view schematically illustrating one example of a configuration of a stand according to a first modification example of the first exemplary embodiment.

FIG. 13 is a view schematically illustrating one example of the configuration of stand 6A according to the first modification example of the first exemplary embodiment.

Stand 6A according to the first modification example is substantially the same as stand 6 in the first exemplary embodiment. However, as illustrated in FIG. 13, the configuration of base 28A of frame 12A in stand 6A of the modification is different from that of base 28 described in the first exemplary embodiment.

Specifically, base 28A is provided with a pair of fixing portions 43a, 49a (one example of a pair of first fixing portions) and a pair of fixing portions 43b, 49b (one example of a pair of second fixing portions).

In that point, base 28A is different from base 28 having only the pair of fixing portions 43, 49. However, except for this point, stand 6A is substantially the same as stand 6. Therefore, the components substantially the same as the components of base 28 are identified by the same reference numerals, and the description thereof will be omitted. In addition, fixing portions 43a, 43b are substantially the same as fixing portion 43 described in the first exemplary embodiment, and fixing portions 49a, 49b are substantially the same as fixing portion 49 described in the first exemplary embodiment.

As illustrated in FIG. 13, in stand 6A, arrangement interval W2 between a pair of fixing portions 43b, 49b is smaller than arrangement interval W1 between a pair of fixing portions 43a, 49a.

In the case where the size of display screen 8a (see FIG. 1) is relatively large (for example, 50 inches), the pair of connection fittings 24, 26 (see FIG. 5) is fixed to the pair of fixing portions 43a, 49a, respectively. In the case where the size of display screen 8a is relatively small (for example, 40 inches), the pair of connection fittings 24, 26 is fixed to the pair of fixing portions 43b, 49b, respectively.

[2-2. Effects and the Like]

As described above, in the present modification, the base of the stand includes a pair of first fixing portions and a pair of second fixing portions that are for fixing the pair of connection members. An arrangement interval between the pair of second fixing portions is smaller than an arrangement interval between the pair of first fixing portions. In a case where the display screen has a first size, the pair of connection members is respectively fixed to the pair of first fixing portions. In a case where the display screen has a second size smaller than the first size, the pair of connection members is respectively fixed to the pair of second fixing portions.

Note that stand 6A is one example of the stand. Base 28A is one example of the base. The pair of connection fittings 24, 26 is one example of the pair of connection members. The pair of fixing portions 43a, 49a is one example of the pair of first fixing portions. The pair of fixing portions 43b, 49b is one example of the pair of second fixing portions. Arrangement interval W1 is one example of the arrangement interval between the pair of first fixing portions. Arrangement interval W2 is one example of the arrangement interval between the pair of second fixing portions. Display screen 8a is one example of the display screen. The 50-inch size described as one example of the size of display screen 8a is one example of the first size, and the 40-inch size described as one example of the size of display screen 8a is one example of the second size.

For example, in the configuration example of stand 6A described in the first modification example, stand 6A includes base 28A. Base 28A includes the pair of fixing portions 43a, 49a and the pair of fixing portions 43b, 49b that are for fixing the pair of connection fittings 24, 26. Arrangement interval W2 between the pair of fixing portions 43b, 49b is smaller than arrangement interval W1 between the pair of fixing portions 43a, 49a. In a case where display screen 8a has a first size (for example, 50 inches), the pair of connection fittings 24, 26 is respectively fixed to the pair of fixing portions 43a, 49a. In a case where display screen 8a has a second size (for example, 40 inches) smaller than the first size, the pair of connection fittings 24, 26 is respectively fixed to the pair of fixing portions 43b, 49b.

With this configuration, the fixing positions of the pair of connection fittings 24, 26 of stand 6A to base 28A can be changed respectively according to the size of display screen 8a. Thus, stand 6A can more stably support display unit 4 (see FIG. 1).

While an example of configuration where two sets of a pair of fixing portions are provided on base 28A in the present modification, the present disclosure is not limited thereto. Three or more sets of a pair of fixing portions may be provided on base 28A.

Second Modification Example of First Exemplary Embodiment

[3-1. Configuration of Stand]

Next, the configuration of stand 6B according to a second modification example of the first exemplary embodiment will be described with reference to FIGS. 14 and 15.

Figure 14:
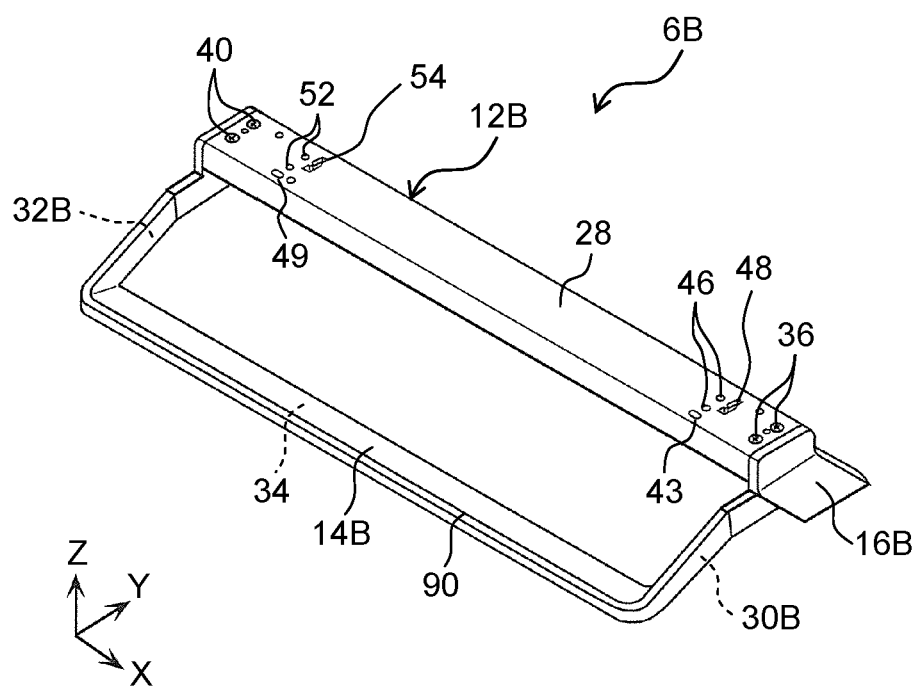
FIG. 14 is a perspective view schematically illustrating one example of a configuration of a stand according to a second modification example of the first exemplary embodiment.

FIG. 14 is a perspective view schematically illustrating one example of the configuration of stand 6B according to the second modification example of the first exemplary embodiment.

Figure 15:
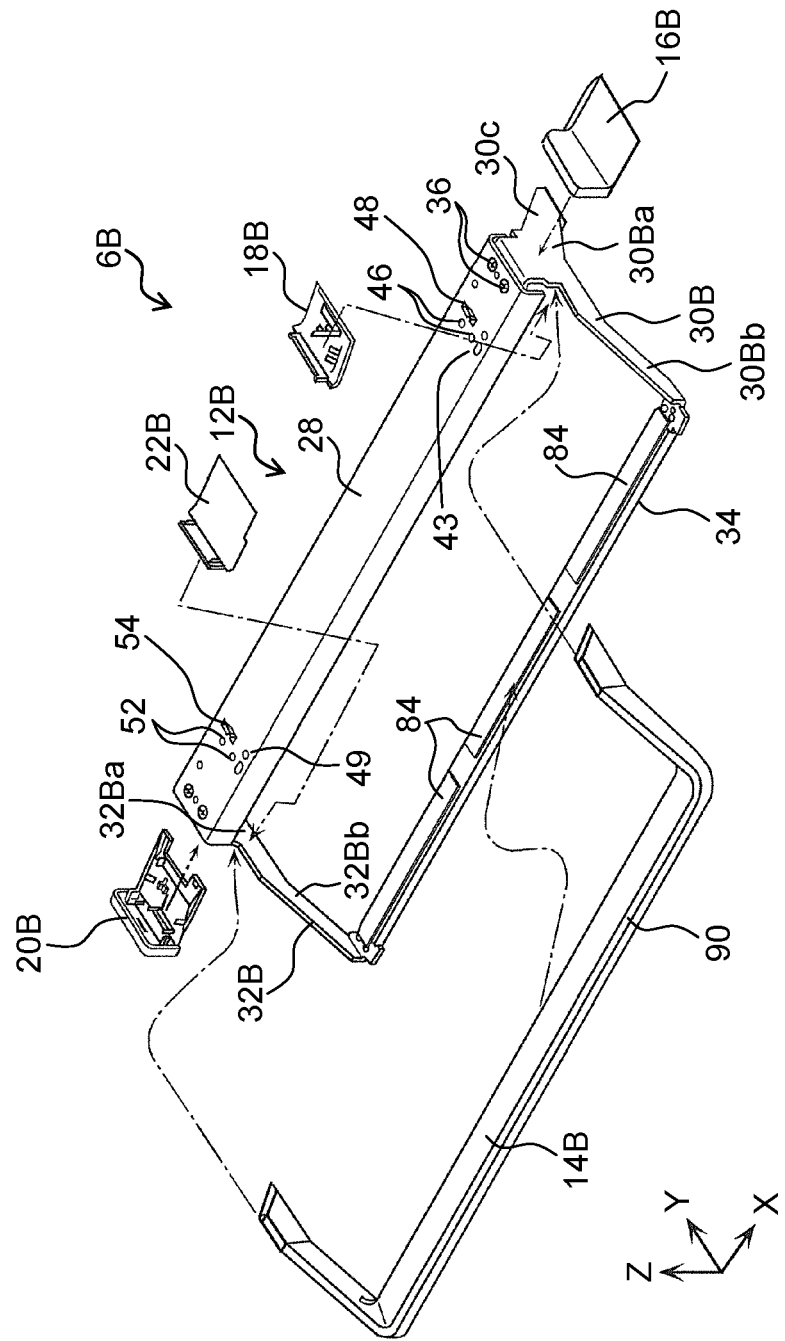
FIG. 15 is an exploded perspective view schematically illustrating the state in which the stand according to the second modification example of the first exemplary embodiment is partially exploded.

FIG. 15 is an exploded perspective view schematically illustrating the state in which stand 6B according to the second modification example of the first exemplary embodiment is partially exploded.

Stand 6B in the second modification example is substantially the same as stand 6 in the first exemplary embodiment. However, as illustrated in FIGS. 14 and 15, the shape of each of a pair of legs 30B, 32B of frame 12B in stand 6B according to the present modification is different from the shape of each of the pair of legs 30, 32 according to the first exemplary embodiment.

Specifically, front-side protruding part 30Bb of leg 30B protrudes toward the front side of display unit 4 (see FIG. 1) from main body part 30Ba while being bent in a reversed V-shape with respect to installment plane 11 on which stand 6B is installed. Similarly, front-side protruding part 32Bb of leg 32B protrudes toward the front side of display unit 4 from main body part 32Ba while being bent in a reversed V-shape with respect to installment plane 11 on which stand 6B is installed. Note that, the lower end of each of main body part 30Ba of leg 30B and main body part 32Ba of leg 32B is recessed into a reversed V-shape with respect to installment plane 11.

According to such shape, front-side cover member 14B has a shape corresponding to the shape of each of legs 30B, 32B. Further, each of first external cover member 16B and first internal cover member 18B has a shape corresponding to the shape of leg 30B. Further, each of second external cover member 20B and second internal cover member 22B has a shape corresponding to the shape of leg 32B.

In these points, stand 6B is different from stand 6 described in the first exemplary embodiment. However, except for these points, stand 6B is substantially the same as stand 6. Therefore, the components substantially the same as the components of stand 6 are identified by the same reference numerals, and the description thereof will be omitted. In addition, among the components of stand 6B, the components having the same names as the components of stand 6 but having the different reference numerals from the components of stand 6 are different in shapes but substantially the same in structures and functions as the components with the same names of stand 6. Therefore, the detailed description thereof will be omitted.

[3-2. Effects and the Like]

Note that the pair of legs 30B, 32B is one example of the pair of legs. For example, as described in the second modification example, the shape of each of the pair of legs 30B, 32B of stand 6B may be different from the shape of each of the pair of legs 30, 32 of stand 6 described in the first exemplary embodiment. Even in this case, the design of the display device can be improved, and display unit 4 can stably be supported by stand 6B.

Third Modification Example of First Exemplary Embodiment

[4-1. Configuration of Display Device]

Next, the configuration of display device 2C according to a third modification example of the first exemplary embodiment will be described with reference to FIGS. 16 and 17.

Figure 16:
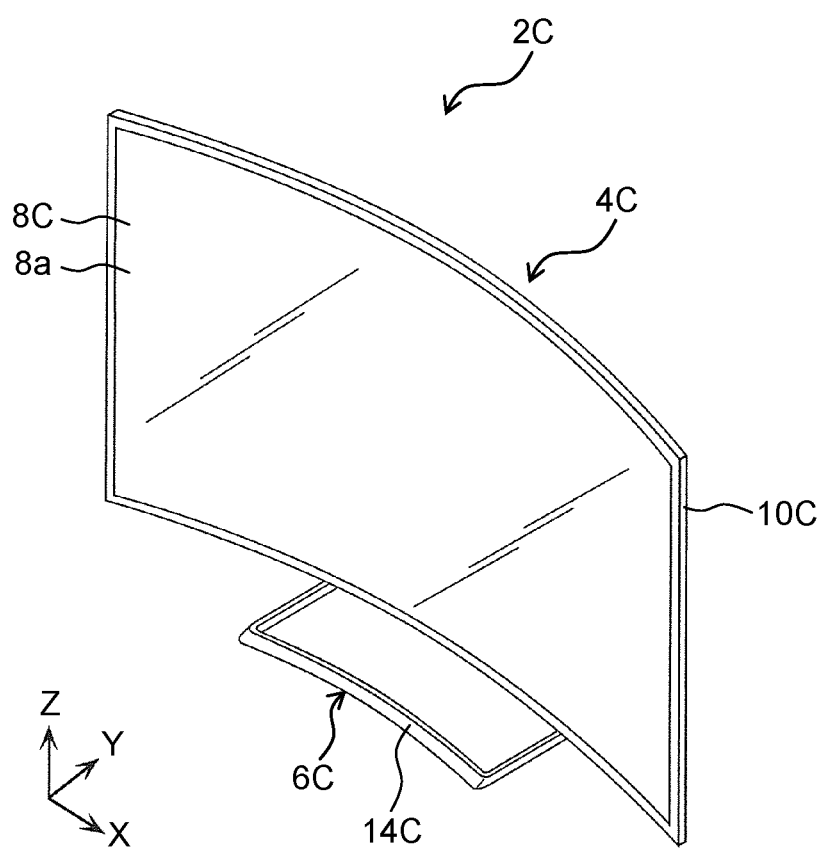
FIG. 16 is a perspective view schematically illustrating one example of a front-side configuration of a display device according to a third modification example of the first exemplary embodiment.

FIG. 16 is a perspective view schematically illustrating one example of a front-side configuration of display device 2C according to the third modification example of the first exemplary embodiment.

Figure 17:
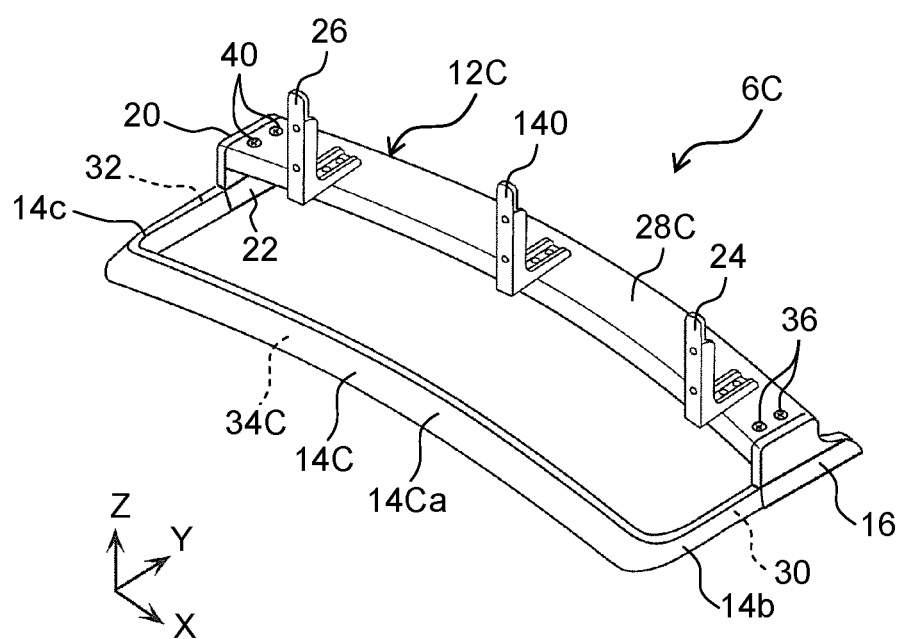
FIG. 17 is a perspective view schematically illustrating one example of a configuration of a stand according to the third modification example of the first exemplary embodiment.

FIG. 17 is a perspective view schematically illustrating one example of the configuration of stand 6C according to the third modification example of the first exemplary embodiment.

Display device 2C according to the third modification example is substantially the same as display device 2 described in the first exemplary embodiment. However, as illustrated in FIG. 16, display device 2C according to the present modification is a liquid crystal television receiver with a curved panel display, which is different from display device 2 described in the first exemplary embodiment.

Specifically, display unit 4C is entirely formed into a curved rectangular panel such that display screen 8a of liquid crystal panel 8C has a concave surface. According to this, housing 10C is formed into a curved rectangular frame. Note that display device 2C may be an organic EL television receiver with a curved panel display.

As illustrated in FIG. 17, in stand 6C according to the present modification, base 28C of frame 12C is formed to be a shape of extending in an arc along a longitudinal direction which is the lateral width direction of display unit 4C while being curved along the rear surface of display unit 4C.

The pair of connection fittings 24, 26 described in the first exemplary embodiment is respectively fixed near both longitudinal ends of base 28C. Further, connection fitting 140 is fixed to the central part of base 28C in the longitudinal direction. The amount of each of protrusion of connection fittings 24, 26, 140 toward display unit 4C from base 28C is substantially the same as each other.

In addition, connection portion 34C of frame 12C is formed to be a shape of extending in an arc along the longitudinal direction which is the lateral width direction of display unit 4C, while being curved according to the curvature of base 28C. Accordingly, main body part 14Ca of front-side cover member 14C similarly extends in an arc along the longitudinal direction which is the lateral width direction of display unit 4C, while being curved.

In these points, display device 2C is different from display device 2 described in the first exemplary embodiment. However, except for these points, display device 2C is substantially the same as display device 2. Therefore, the components substantially the same as the components of display device 2 are identified by the same reference numerals, and the description thereof will be omitted. In addition, among the components of display device 2C, the components having the same names as the components of display device 2 but having the different reference numerals from the components of display device 2 are different in shapes but substantially the same in structures and functions as the components with the same names of display device 2. Therefore, the detailed description thereof will be omitted.

[4-2. Effects and the Like]

As described above, in the present modification, the display unit of the display device has a display screen which is curved to have a concave surface, and the base extends in the lateral width direction of the display unit while being curved along a rear surface of the display unit.

Note that display device 2C is one example of the display device. Display unit 4C is one example of the display unit. Display screen 8a is one example of the display screen. Base 28C is one example of the base.

For example, in the configuration example of display device 2C described in the third modification example, display device 2C has display unit 4C. Display unit 4C is curved such that display screen 8a has a concave surface. Base 28C extends in the lateral width direction of display unit 4C while being curved along the rear surface of display unit 4C.

Thus, even when display device 2C is a liquid crystal television receiver with a curved panel display, for example, the design of display device 2C can be improved, and display unit 4C can stably be supported by stand 6C.

The present modification describes the example in which base 28C extends in an arc in the longitudinal direction which is the lateral width direction of display unit 4C while being curved. However, the present disclosure is not limited thereto. In the case where display device 2C is a liquid crystal television receiver with a curved panel display, base 28C may linearly extend in the longitudinal direction which is the lateral width direction of display unit 4C, as in the first exemplary embodiment. In this case, the amount of protrusion of each of the pair of connection fittings 24, 26 toward display unit 4C from base 28C is larger than the amount of protrusion of connection fitting 140 toward display unit 4C from base 28C according to the curvature of display unit 4C.

Other Exemplary Embodiments

As described above, the first exemplary embodiment and the first to third modification examples thereof have been described above as an example of the technique according to the present disclosure. However, the technique in the present disclosure is not limited thereto, and is applicable to embodiments to which modification, replacement, addition, omission, or the like is made as appropriate. In addition, the components described in the first exemplary embodiment and the first to third modification examples thereof can be combined to form a new embodiment.

In view of this, other exemplary embodiments will be described below.

The first exemplary embodiment and the first to third modification examples describe the configuration in which display device 2 is a liquid crystal television receiver. However, the present disclosure is not limited thereto. Display device 2 may be composed of a liquid crystal display for a personal computer or an organic electro-luminescence (EL) display, for example.

The first exemplary embodiment and the first to third modification examples describe the configuration in which base 28 and the pair of connection fittings 24, 26 are separately provided. However, the present disclosure is not limited thereto. For example, base 28 and the pair of connection fittings 24, 26 may be integrally formed.

The first exemplary embodiment and the first to third modification examples describe the configuration in which frame 12 has connection portion 34. However, the present disclosure is not limited thereto. For example, connection portion 34 may be eliminated.

The first exemplary embodiment and the first to third modification examples describe the configuration in which base 28 and each of the pair of legs 30, 32 are separately provided. However, the present disclosure is not limited thereto. For example, base 28 and each of the pair of legs 30, 32 may be integrally formed.

The first exemplary embodiment and the first to third modification examples describe the configuration in which first external cover member 16 has claws 92, 94, 96, 98, and first internal cover member 18 has cutouts 104, 106 and holes 112, 114. However, the present disclosure is not limited thereto. For example, the configuration opposite to this configuration may be employed. Specifically, first external cover member 16 may have cutouts 104, 106 and holes 112, 114, and first internal cover member 18 may have claws 92, 94, 96, 98.

The first exemplary embodiment and the first to third modification examples describes the configuration in which front-side cover member 14 is fixed to connection portion 34 with a plurality of double-face adhesive tapes 84. However, the present disclosure is not limited thereto. For example, one of front-side cover member 14 and connection portion 34 may be provided with a claw, and the other may be provided with a recess. In this case, front-side cover member 14 is fixed to connection portion 34 by the engagement between the claw and the recess.

As described above, the exemplary embodiment and the modification examples have been described above as an example of the technique according to the present disclosure. The accompanying drawings and the detailed description are provided for this purpose.

Accordingly, the components illustrated in the accompanying drawings and described in the detailed description may include not only components necessary for solving the technical problems, but also components that are not necessary for solving the technical problems but are merely provided for illustrating the above-described technique. Therefore, the unnecessary components illustrated in the accompanying drawings or described in the detailed description should not be immediately acknowledged to be necessary components.

The above exemplary embodiments are intended to illustrate the technique of the present disclosure, and thus various changes, replacements, additions, omissions or the like can be made within the scope of the claims or in a scope equivalent thereto.

INDUSTRIAL APPLICABILITY

The present disclosure is applicable to a display device provided with a stand. Specifically, the present disclosure is applicable to a liquid crystal display of a liquid crystal television receiver or a personal computer, for example.

REFERENCE MARKS IN THE DRAWINGS 2, 2C: display device
4, 4C: display unit
4a: lower edge
6, 6A, 6B, 6C: stand
8, 8C: liquid crystal panel
8a: display screen
10, 10C: housing
10a: front cabinet
10b: rear cabinet
11: installment plane
12, 12A, 12B, 12C: frame
14, 14B, 14C: front-side cover member
14a, 14Ca: main body part
14b, 14c: extension part
16, 16B: first external cover member
18, 18B: first internal cover member
20, 20B: second external cover member
22, 22B: second internal cover member
24, 26, 140: connection fitting
24a, 26a: one side
24b, 26b: other side
28, 28A, 28C: base
30, 30B, 32, 32B: leg
30a, 30Ba, 32a, 32Ba: main body part
30b, 30Bb, 32b, 32Bb: front-side protruding part
30c, 32c: back-side protruding part
34, 34C: connection portion
36, 40, 44, 50, 60, 72, 136, 138: screw
38, 42, 80, 82, 124, 126, 130, 132: insertion hole
43, 43a, 43b, 49, 49a, 49b: fixing portion
46, 52, 58, 62, 70, 74: screw hole
48, 54: through-hole
56, 68: support portion
64, 76, 118: recess
66, 78: rubber foot
84: double-face adhesive tape
86, 88: claw
90: mirror surface
92, 94, 96, 98: claw
100, 102: guide portion
104, 106: cutout
104a, 106a: perpendicular part
104b, 106b: horizontal part
108, 110: engagement piece
112, 114: hole
116, 128, 134: hook
120, 122: projection

The invention claimed is:

1. A display device comprising:
a display unit provided with a display screen on a front side; and
a stand that supports the display unit from below,
wherein the stand includes:
a base that supports the display unit at a rear side of the display unit and extends in a lateral width direction of the display unit;
a pair of legs that supports both longitudinal ends of the base from below respectively and extends across a lower edge of the display unit in a front-rear direction; and
a connection portion that connects an end of each of the pair of legs on the front side of the display unit to each other,
wherein one longitudinal end of the connection portion is detachably fixed to the end of one of the pair of legs, and another longitudinal end of the connection portion is detachably fixed to the end of another one of the pair of legs,
wherein the stand further includes:
an external cover member that covers the leg from outside of the stand; and
an internal cover member that covers the leg from inside of the stand to interpose the leg between the internal cover member and the external cover member,
wherein one of the external cover member and the internal cover member has a claw, and
wherein the other of the external cover member and the internal cover member has an engaged portion with which the claw is engaged.

2. The display device according to claim 1, wherein the stand further includes a pair of connection members that is disposed on the base at an interval in a longitudinal direction of the base to connect the base and a rear surface of the display unit.

3. The display device according to claim 2, wherein
the base includes a pair of first fixing portions and a pair of second fixing portions that are for fixing the pair of connection members,
an arrangement interval between the pair of second fixing portions is smaller than an arrangement interval between the pair of first fixing portions,
in a case where the display screen has a first size, the pair of connection members is respectively fixed to the pair of first fixing portions, and
in a case where the display screen has a second size smaller than the first size, the pair of connection members is respectively fixed to the pair of second fixing portions.

4. The display device according to claim 1, wherein the pair of legs is detachably fixed to both the longitudinal ends of the base, respectively.

5. The display device according to claim 1, wherein
the engaged portion is a cutout formed on an outer peripheral edge of the other of the external cover member and the internal cover member, and the other of the external cover member and the internal cover member further has a projection disposed near a tip of the claw engaged with the cutout.

6. The display device according to claim 1, wherein the stand further includes a front-side cover member that covers each of the connection portion and the pair of legs from outside of the stand.

7. The display device according to claim 6, wherein a mirror surface is formed on a surface of the front-side cover member.

8. The display device according to claim 1, wherein
the display screen of the display unit is curved to have a recessed surface, and
the base extends in the lateral width direction of the display unit while being curved along a rear surface of the display unit.

9. A stand for supporting a display unit having a display screen from below, the stand comprising:
a base that extends in one direction and supports the display unit at a rear side of the display unit;
a pair of legs that supports both longitudinal ends of the base from below respectively and extends in a direction crossing a longitudinal direction of the base; and
a connection portion that connects an end of each of the pair of legs on a front side of the display unit to each other,
wherein one longitudinal end of the connection portion is detachably fixed to the end of one of the pair of legs, and another longitudinal end of the connection portion is detachably fixed to the end of another one of the pair of legs,
wherein the stand further comprises:
an external cover member that covers the leg from outside of the stand; and
an internal cover member that covers the leg from inside of the stand to interpose the leg between the internal cover member and the external cover member,
wherein one of the external cover member and the internal cover member has a claw, and
wherein the other of the external cover member and the internal cover member has an engaged portion with which the claw is engaged.

* * * * *